United States Patent [19]
Nilsson et al.

[11] Patent Number: 5,255,273
[45] Date of Patent: Oct. 19, 1993

[54] METHOD FOR ASCERTAINING MODE HOPPING FREE TUNING OF RESONANCE FREQUENCY AND THE Q-VALUE OF AN OPTICAL RESONATOR AND A DEVICE FOR CARRYING OUT THE METHOD

[75] Inventors: Olle B. Nilsson, Akersberga; Kennet J. Vilhelmsson, Partille, both of Sweden

[73] Assignee: Radians Innova AB, Goteborg, Sweden

[21] Appl. No.: 849,014
[22] PCT Filed: Sep. 7, 1990
[86] PCT No.: PCT/SE90/00573
   § 371 Date: Apr. 21, 1992
   § 102(e) Date: Apr. 21, 1992
[87] PCT Pub. No.: WO91/03848
   PCT Pub. Date: Mar. 21, 1991

[30] Foreign Application Priority Data
Sep. 7, 1989 [SE] Sweden ................. 8902948

[51] Int. Cl.$^5$ ................. H01S 3/10
[52] U.S. Cl. ................. 372/20; 372/102
[58] Field of Search ............ 372/20, 102, 14, 15

[56] References Cited
U.S. PATENT DOCUMENTS
4,873,692  10/1989  Johnson et al. ............ 372/102

FOREIGN PATENT DOCUMENTS
3544266  6/1986  Fed. Rep. of Germany.
2319222  2/1977  France.

*Primary Examiner*—Rodney B. Bovernick
*Assistant Examiner*—Robert E. Wise
*Attorney, Agent, or Firm*—Merchant & Gould, Smith, Edell, Welter & Schmidt

[57] ABSTRACT

Method and apparatus to ensure tuning without mode hopping of the resonator frequency and tuning of the Q-value of an optical resonator of the type comprising a partially reflecting resonator mirror (2) and a movable reflecting optical grating, with grooves (GR) parallel to the resonator mirror, intended to function as a wavelength selective reflector and which may comprise optical elements between the mirror and the grating, said optical elements being intended for collimation, amplification (4) and filtering of the radiation in the resonator, so that when changing the resonance wavelength ($\lambda$) of the resonator or its Q-value, the grating is moved in such a way that a line (C) on the grating which is defined at a tuned initial position of the resonator by the intersection of the plane of grating grooves (M) and the virtual mirror plane (5) of the resonator mirror, remains at a distance less than $\lambda/4$ from the virtual mirror plane, which as a result of chromatic dispersion in the resonator media slides in distance to the fixed mirror with said resonator wavelength during the movement.

12 Claims, 10 Drawing Sheets

METHOD FOR ASCERTAINING MODE HOPPING FREE TUNING OF RESONANCE FREQUENCY AND THE Q-VALUE OF AN OPTICAL RESONATOR AND A DEVICE FOR CARRYING OUT THE METHOD

TECHNICAL FIELD

The present invention refers to a method and an apparatus to wavelength tune an optical resonator without mode hops of the type comprising an adjustable optical grating, a partially reflecting mirror and transmission components, e.g. an amplifying optical element and an optical element to collimate the radiation which oscillates in the cavity. An important application of the invention is that of a laser cavity. The method of the invention is applicable to UV, light, IR and mm-waves.

The conditions for tuning an optical grating - mirror resonator, the relations (2) and (3), have been known for a long time. A method used in practice to perform this tuning is to have two from each other independent movements, one rotation of the grating according to (2) and one displacement of the grating at right angles to the mirror plane according (3):

If one, however, wishes to achieve a continuous change of the tuning without mode hopping, that is without changing the longitudinal ordinal number N in relation (3), both movements have to be automatically coordinated. There are in the litterature some proposed methods to establish mechanically a connection between the movements so that the oridinal number N of the resonance mode is maintained with the resonance frequency of the resonator is continuously changed.

FIG. 3 shows earlier practical designs of tunable grating-mirror resonators.

In reference 1., F. Favre et.al., Electronics Letters, 17th Jul. 1986, Vol.1 22, No 15, pp.795-6, FIG. 3a, the grating is fixedly mounted on an arm. The arm has two bearing arrangements for rotation, one at the grating end and the other at the opposite end. The one at the grating end is moved along a rail in the direction of the resonator axis. The other is moved along a rail parallel to the plane of the fixed mirror. This mechanical device restricts the movement of the grating in such a way that the relations (2) and (3) are satisfied.

Ref. 1 also shows that within a small wavelength interval it is possible to satisfy the tuning conditions by rigid rotation of the grating about the fixed point P in FIG. 3a. As can be seen, P is chosen in such a way that a small rotation around this point displaces the grating in the direction of the resonator axis.

The solution given in ref. 1 refers to mode hop free continuous tuning of a resonator with a fixed mirror and a movable reflective grating. A characteristic feature of the solution is that it meets s demand to use the same portion of the grating surface for reflection in the resonating, that is limited by the fixed mirror. This implies that the number of nodal planes in the standing wave of the resonator is kept unchanged in tuning to a new wavelength. In a tunable laser constructed according to this principle the laser beam remains fixed with respect to the grating grooves when the grating is moved.

The solution from ref. 1 in FIG. 3a in principle an exact solution, which simulates equations (2) and (3) over the whole range of angles $\alpha$ in the dispersion free resonator. It is stated in reference 1, that one can make a slight geometric modification, which compensates for chromatic dispersion. The means for doing this have not been specified.

The result in ref. 1 shows that in practice the tuning range is limited to 15-30 nm in a solid state laser at 1550 nm. The solution with rigid rotation around the axis P in FIG. 3a gives both theoretically and experimentally a tunable range of 2-3 nm in the same solid state laser.

There are also tunable solid state lasers, reference 2, J. Mellis et. al., Electronics Letters, 4th Aug. 1988, vol. 24, No 16, pp. 988-9, see FIG. 3b, where the grating is adjusted with a screw to a starting position and fine tuning is accomplished by piezo electric means which tilt, rotate and translate the grating to achieve mode hop free tuning within an interval of 0.5 nm. With the adjusting screws the wavelength range 1515-1555 nm is covered.

DETAILED DESCRIPTION OF THE INVENTION

A conventional optical resonator, eg. a laser resonator, see FIG. 1, consists of two mirrors and intermediate transmitting media.

Normally it oscillates on more than one (quasi-)monochromatic light frequency. The distance between two resonator modes is defined by the optical cavity length 1 of the resonator according to $$\delta v = c/2l \qquad (1)$$

where c is the velocity of light in air. In a laser the number of oscillating resonator modes depends on the linewidth $\Delta v$ of the amplifier material and the threshold level for lasing of the resonator. Equation (1) shows that the oscillating frequency of the resonator will change if the length of the cavity is changed.

A method to limit the number of oscillating resonator modes is to exchange the mirror 1 by an element which is wavelength dispersive, e.g. an optical reflection grating with the grooves of the grating parallel to the mirror surface 3.

The grating is then used in Littrow configuration, that is, the grating reflects back light of the desired wavelength in a direction which is opposite to that of the incident light. The grating is often designed for use in the first order of interference.

In this case the applicable grating relation is $$\sin \alpha = \lambda/2d \qquad (2)$$

$\lambda$ is the wavelength of light in air
d is the grating constant
$\alpha$ is the angle of incidence (& exit) of light
as measured from the the direction normal to the grating surface.

The grating relation is also satisfied by shorter wavelengths $\lambda_p = \lambda/p$, where p is the ordinal number for constructive interference. In eq. (2) $\lambda$ is then replaced by $p\lambda_p$.

We now assume with reference to FIG. 2 that the mirror 2 and a transmission material 4 with the length a have a fixed to the fixed components. The mean level of the relief is a plane M. It is well known that a standing optical wave with the wavelength $\lambda$ can be developed between the grating and the mirror if the resonator is adjusted such that both the grating relation (2) and a longitudinal resonator condition are satisfied. A general formulation of the latter is that the optical length of the resonator shall be an integer multiple of $\lambda/2$. The standing wave has nodal planes which are parallel to the mirror plane 3. The mutual distance between neighbouring planes is $\lambda/2$. The nodal planes can be considered as tied to the planar parts of the grating grooves, which are nearly parallel to the plane 3. We assume that the resonator in a first position of the grating is trimmed to resonance at the wavelength $\lambda_0$. The nodal planes intersect the plane M in lines, which we in the following let represent the grating grooves. In the section, FIG. 2, these lines are shown as points, which we designate as grating points. In the further mathematical discussion of tuning conditions, which refers to the plane in FIG. 2, the movable grating is represented by a line with grating points, where the mutual distance between the points is the grating constant d.

The optical distance between a reference point on the grating and the mirror 2 is greater than the corresponding geometrical distance. The difference in distance is $(n-1)a$, where n is the refractive index of an intermediate medium (as referred to air) and a is the extension (length) of the which is displaced with respect to the mirror surface 3 a distance equal to the difference in optical and geometrical distances. If the resonator contains further optical transmission components, eg. lenses, the refractive indices and lengths of these will naturally have to be taken into account in a corresponding manner when the virtual surface in FIG. 2 is introduced.

We consider a starting position in which the optical resonator is tuned to resonance, FIG. 2. The transmission components are set up and adjusted along a central axis, eg. a lens axis, which is normal to the mirror surface 3. We now define a certain grating point A as the grating point which lies nearest to the central axis. The normal Ab'B to the mirror surface 3 has the foot point B' on the surface 3 and the footpoint B on the virtual surface 5. When the grating is moved, the point A, which is fixed to the grating is moved and the foot points B' and B run along the mirror surfaces 3 and 5, respectively.

In the resonator, which is tuned to the wavelength $\lambda_0$, we number the nodal planes $0, 1, 2, \ldots N, N+1$, where the nodal plane 0 is located on the surface 3 of the fixed mirror and the nodal plane N is tied to the grating groove which is represented by the grating point A.

In the virtual mirror representation the nodal plane 0 will correspond to the virtual surface 5 and the nodal plane N is as in the real representation, tied to A. In the virtual representation the nodal planes are equidistant with mutual distances $\lambda_0/2$.

The optical distance AB is $$l = N\lambda_0/2 = l_1 + a(n-1) \quad (3)$$

The grating points in FIG. 2 can be numbered in a corresponding way as the nodal planes. The grating point A has the ordinal number N. We introduce a virtual extension of the grating. In the tuned resonator a virtual grating point lies in the virtual mirror plane 5, that is in the nodal plane 0. This grating point thus has the ordinal number 0. The movable grating is represented by a line of numbered points fixed to the grating. The length of the line AC is $N*d$.

If the wavelength tuning of a laser resonator is made by moving the grating in such a fashion that the grating equation (2) and the resonator condition (3) are both satisfied, the mode number N of the resonator will be conserved upon changing the wavelength. If the grating is dispersive enough, the resonator will be tuned to only one mode.

TUNING CONDITIONS

Tuning conditions without chromatic dispersion in the resonator

A resonator without chromatic dispersion implies that the media inside the resonator have refractive indices which can be considered as constants, FIG. 4–6.

The mode number N in the tuned mirror-grating resonator in FIG. 2 is defined by the N:th nodal plane in the standing optical wave always being related to the N:th grating groove, that is the grating point A in FIG. 2.

Let us now move the grating from position 0 to position 1, so that the grating point C is moved $\delta x'$, $\delta y'$ in the fixed coordinate system $x'$, $y'$ in FIG. 6 and the grating is rotated simultaneously an angle $\delta\alpha = \beta$. We see, that if the virtual mirror surface had been situated at the line CB, in position 1, both the grating relation and the longitudinal condition would have been satisfied for the N:th mode at a new wavelength. The virtual mirror surface is however associated with the fixed components and remains at the $x'$-axis when the grating is moved. We then get a detuning in the N:th mode at the wavelength $\lambda_1$ which as expressed by the longitudinal mode condition becomes $$\delta N = \delta y'/(\lambda_1/2) \quad (4)$$

Provided $$|\delta N| < \tfrac{1}{2} \quad (5)$$

the tuning is better adapted to the mode N, than to the rest of the modes. The corresponding geometrical displacement condition is $$\delta y' < \lambda_1/4 \; (\approx \lambda_0/4) \quad (6)$$

The tuning is however not affected, compare FIG. 6, by the grating displacement $\delta x'$, that is, the grating can be translated in the x - direction without detuning a mode.

Conclusion

The allowed movement of the grating in a resonator, if one wishes to maintain the tuning to an original mode N is a rotation around the grating point C combined with a translation of this point along the x- axis. The tuning frequency is changed by the rotation, but is not affected by the translation. Renouncing ideal tuning, the movement mentioned gives a better adaptation to the N:th mode than to any other mode if the displacement of C from the x-axis is less than $\lambda_0/4$.

Tuning conditions with chromatic dispersion in the resonator.

In case of a resonator, FIG. 7, with a medium which extends a distance a in the axial direction and has the refractive index n we introduce a virtual mirror plane at the distance $L_v$ from the real mirror plane:

$$L_v = a(n-1) \quad (7)$$

If there are several materials in the resonator or if the refractive index varies along the central axis, $L_v$ in the formula (7) will be expressed as a sum or an integral. In the expansion of n by a series also derivatives of n at the initial wavelength $\lambda_0$ appear. Henceforth we let $a.f(\lambda_0)$ generally stand for $$\int_0^a f(\lambda_0) dz,$$

where $f(\lambda_0)$ represents $n(\lambda_0) \approx n_0$ and its derivatives $n'(\lambda_0) = n'_0$, $n''(\lambda_0) = n'_0 \ldots$ When the angle of rotation $\alpha$ is increased the resonance wavelength is increased and the relevant refractive index generally diminishes from $n_0$ to $n$. The virtual plane is displaced in space towards the rear mirror:

$$\delta l' = a (n_0 - n) \quad (8)$$

Through rotation $\alpha_0 \rightarrow \alpha_1$, about an axis $C_1$ parallel to C, in the grating plane, C is displaced relative to the mirror:

$$\delta l = K (\lambda_1 - \lambda_0)/2 \quad (9)$$

A nodal plane associated with the grating and which goes through the axis C follows the virtual plane in the rotation $\alpha$ of the grating if $\delta 1 = \delta 1'$ in the relevant interval.

$$K = 2a (n_0 - n_1)/ (\lambda_1 - \lambda_0)$$

K is a constant when $n'(\lambda_0)$ is a constant $$K = -2a \, n'_0$$

The distance along the grating from the rotation axis $C_1$ to the grating line C is K d. Generally K is not an integer. The K-plane through $C_1$ is a plane for constant phase in the standing wave. It is not in general a nodal plane. Only if K is an integer it is a nodal plane.

It is in principle necessary to make two adjustments in order to get the system in FIG. 7 to function. The rotation axis must be at a given distance $L_{c1}$ from the fixed mirror plane. The corresponding distance for the virtual plane, which slides with the change in wavelength, is $$L_v = a (n - 1) \quad (11)$$

$$L_{c1} = L_v + K \lambda/2$$

When approaches 0 the virtual plane approaches the K-plane and the linearly varying n approaches $n_c$ = constant.

$$C_{c1} = a(n_c - 1) \quad (13)$$

The distance $L_c$ is associated with a certain phase of the axis $C_1$ relative the periodic ruling of the grating. The phase position adjustment involves a small displacement, $< d/2$, of the grating relative to $C_1$.

It is also possible to compensate for the effect of higher orders of the dispersion by another choice of rotation axis. With a suitable choice of the axis $C_2$ on the mirror normal through $C_1$, the second degree term $\beta^2$ in the sliding between the C-axis and the virtual plane vanishes.

We make an expansion of n by series $$n = n_0 + n'_0 \lambda_\beta + n''_0 \lambda^2_\beta/2! + n'''_0 \lambda^3_\beta/3! + \quad (14)$$

where $\lambda_{62} = \lambda - \lambda_0$

The sliding between the C-axis and the virtual mirror plane is obtained from FIG. 8.

$$\delta 1 - \delta 1' = y_{c1} (\cos\beta - 1) + K\lambda_\beta/2 - a(n_0 - n) \quad (15)$$

up to terms of third power in $\beta$ and $\lambda_\beta$ at series expansion according to (14) and of $\cos \beta$ and with use of (10) and substitution of $\lambda_\beta$ according to $$\lambda_\beta = \lambda_0 (\cot\alpha_0 \beta - \beta^2/2 - \cot\alpha_0 \beta^3/6) \quad (16)$$

and when $y_c$ is given the value $$y_{c1} = a \, n''_0 \lambda_0^2 \cot^2\alpha_0 \quad (17)$$

one obtains
$$\delta 1 - \delta 1' = \epsilon \beta^3 \quad (18)$$

where
$$\epsilon = (-\lambda_0^2 \cot\alpha_0 \, an''_0/2 + \lambda_0^3 \cot^3\alpha_0 \, an'''_0/6) \quad (19)$$

If we select a new rotation axis R with the coordinates $x_R$ and $y_R$ in the coordinate system x, y in FIG. 8 the displacement of the $C_2$-axis at a rotation $\beta$ will be $$\delta y_{c2} = -x_R \sin\beta + y_R (1 - \cos\beta) \quad (20)$$

$$\delta 1 - \delta 1' = \delta y_{c2} + \epsilon \beta^3 \quad (21)$$

The third power term in $\sin \beta$ of (20) is in general of no interest as compared to $\epsilon \beta^3$ and we may write $$\delta 1 - \delta 1' = x_R \beta + y_R \beta^2/2 + \epsilon \beta^3 \quad (22)$$

If we instead write the relation (22) in the coordinate system $x'$, $y'$ which has the initial ($\alpha = \alpha_0$) position of C as its origin we obtain $$\delta 1 - \delta 1' = -(x'_R - x'_{c2})\beta + (y'_R - y'_{c2}) \beta^2/2 + \epsilon \beta^3 \quad (23)$$

where the coordinates for the axes $C_1$ and $C_2$ at the angle $\alpha_0$ are:

$$x'_{c1} = a\lambda_0 \, n' \cot \alpha_0, \quad y'_{c1} = a\lambda_0 \, n'_0, \quad x'_{c2} = x'_{c1},$$
$$y'_c = -a\lambda_0^2 \, n'' \cot^2 \alpha_0 \quad (24)$$

The original mode N can not oscillate if (22) is equal to or exceeds $\lambda_0/4$ at a rotation $\beta$ about a selected axis R, that is if $|\delta N| > \frac{1}{2}$. A minimum demand for stable oscillation in the mode N is:

$$|-x_R \beta + y_R \beta^2/2 + \epsilon \beta^3| < \lambda/4 \quad (25)$$

The relation (25) is valid when the resonator in the initial position is optimally tuned so that C coincides with the virtual plane. If C in the initial position is situated a at a border of the zone $\pm \lambda/4$ around the virtual plane, which for the mode N is a permitted location for C, the following is valid $$|-x_R \beta + y_R \beta^2/2 + \epsilon \beta^3| < \lambda/2 \quad (26)$$

when C goes from one border to the other at the rotation $\beta$. It is possible to find more favourable rotation axes than $C_2$. In relation (22) one can e.g. select $x_R = x_\epsilon$ and $y_R = 0$ so that the first and third power terms balance each other in the outermost parts of a certain swing where the relation (25) is satisfied. For the axis $C_\epsilon$ with $$x_\epsilon = 3/4 \sqrt[3]{\epsilon \lambda_0^2}, y_\epsilon = 0 \tag{27}$$

we get $$\beta \text{ swing} = \pm \sqrt[3]{\lambda_0/\epsilon} \tag{28}$$

As compared t the permitted swing of angles for $C_2$ the swing in (28) is greater by a factor $\sqrt[3]{4}$. We can specify a tolerance area within which the rotation axis R must be located in order to have a total swing $\beta_s > \beta_g$. We place a tolerance area around $C_2$ with the limit swing $\beta_g$, where $\beta_g$ is small enough that the residual term $\epsilon \beta^3$ in (22) can be neglected. We assume that after the axis of rotation has been located within the tolerance area, an optimal adjustment of the grating is carried out by moving it a distance $<d$ along the grating plane so that the permitted zone, with the width $\lambda/2$ around the virtual plane, is placed as favourably as possible, considering that the axis has to remain within the zone during the whole rotation $\beta_g$. The tolerance range for R around $C_2$ is limited by four lines.

$$\pm \lambda/2 = x_g \sin \beta_g + y_g (1 - \cos \beta_g) \tag{29}$$

two parabolas $$X^2_g = (\pm y_g + \lambda/4) \tag{30}$$

and a circle with the center at the origin which has the radius $$r = \lambda/2(1 - \cos \beta_g/2) \tag{31}$$

The tolerance area, FIG. 9, has a sand-glass like shape and for small values of $\beta_g$ it becomes very extended along the y-axis. The total length along the y-axis is $2r$ and the largest width is $$2x_2 = 2r \sin (\beta_g/2) \tag{32}$$

The total width at the waist is $$2x_0 = \lambda/\sin \beta_g \tag{33}$$

The sand-glass represents the tolerance area only when $\beta_g^3$ and higher terms can be neglected. For large values of the swing $\beta_g$ there are axes with permitted swing $\beta_s > \beta_g$ which lie outside the sand-glass, e.g. $C_\epsilon$. We can give a practically interesting selection area $T = 2r \cdot 2x_2$ for the rotation axis where the parameters $r$ and $x_2$ are selected at $\beta_g = 10$ milliradians.

The selection area for the rotation axis R is centered around $C_2$ and has the total length 80 000 $\lambda$ in the direction of th mirror normal and the total width 400 $\lambda$ in a direction parallel with the mirror plane $$T = 80\ 000\ \lambda \cdot 400\ \lambda \tag{34}$$

Numerical example

We select a semiconductor material in a resonator with the following data:
$n_0 = 3,184$; $n'_0 = -0,166\ \mu m^{-1}$; $n_0'' = 0,290\ \mu m^{-2}$
$n_0''' = -1,32\ \mu m^{-3}$
$\lambda_0 = 1,45\ \mu m$ $a = 500\ \mu m$ $\alpha_0 = 45°$ this gives $\epsilon = -488\ \mu m$ $x'_{c1} = -120\ \mu m$ $y'_{c1} = -120\ \mu m$
$x'_{c2} = -120\ \mu m$ $y'_{c2} = -425\ \mu m$ $x_\epsilon = -7,6\ \mu m$ The sand-glass, FIG. 9, has a waist $x_0 = \pm 2,55\ \mu m$, when the total swing for $C_\epsilon$ is $$\beta_s = 2 \sqrt[3]{\lambda_0/\epsilon} = 16,5°.$$

The axis $C_\epsilon$ thus lies outside the sand-glass, as a consequence of the term $\epsilon \beta^3$, which by definition is not negligible since it is chosen to balance the first power term. On the other hand, as assumed in the procedure of balancing, the third power term in (20), that is $x_\epsilon \beta^3/6 = 1,27\ \beta^3$, is negligible as compared to $\epsilon \beta^3 = -488\ \beta^3$.

The table below which is based on the numerical data above, indicates the wavelength swing that can be reached with the original oscillating mode retained in the resonator as the most favoured mode. It is on the other hand not probable that for example in a laser resonator there is a stable oscillation over the whole swing. A reduction of the table values with a factor 2 is more likely for this. The axes in the table correspond to FIG. 10.

| Rotation axis: | $C_2$ | $C_\epsilon$ | $C_1$ | P | C | D |
|---|---|---|---|---|---|---|
| Swing in nm | ±130 | ±210 | ±70 | ±4 | ±4 | ±0.4 |

MAIN FEATURES OF THE PRESENT INVENTION

The object of the present invention is to provide a tunable optical resonator, which in a simple way can be wavelength tuned without mode hops over a wide frequency range. The resonator can preferably be used in a tunable laser.

A further object of the present invention is to provide an optical resonator with variable Q-value at a fixed frequency.

The basic characteristics of the invention are:
1. A movement of the grating parallel to the plane of the fixed mirror does not affect the tuning to a certain resonator frequency. On the other hand the resonator zone sweeps over the grating surface and the number of nodal planes in the standing wave is changed. This implies that at a translation of the grating parallel to the fixed mirror, the Q-value of the resonator will be changed but the resonance frequency maintained.
2. In a grating mirror resonator tuned in an initial grating position in air (vacuum), see FIG. 5, where the grating grooves are parallel to the mirror, tuning is maintained to resonance when the grating is rotated about the line of intersection line C between the grating groove plane and the mirror plane. In rotating the grating around the line C the resonance frequency is changed continuously but the number of nodal planes in the standing wave between a certain grating groove and the fixed mirror is maintained, that is the tuning is carried out without mode hopping. During the rotation the resonator zone will slide over the grating surface, causing the number of nodal planes in the zone to change, that is the Q-value will be changed continuously. See FIGS. 4 and 5.
3. The tuning conditions given for the resonator in air are also valid for dense media in the resonator if the real mirror is substituted by its virtual mirror plane.

In tuning to a new wavelength the virtual mirror plane will, depending on the wavelength dispersion, slide in its normal direction. The tuning of the resonator is maintained only if the rotation axis, which is fixed in the grating and constitutes the line of intersection between the grating plane and the virtual mirror plane, follows the virtual plane as it slides with changing resonance frequency.

4. The condition that the grating fixed point of intersection lies in the virtual mirror plane can be realized within a wide range of wavelengths and angles if a rotation axis R is selected such that C in the rotation about R follows the change of position of the virtual plane as the resonance wavelength is altered. Within a wavelength region, where the wavelength dispersion $dn/d\lambda$ is constant, R should be chosen as the line of intersection $C_1$, of the constant phase plane for the spatial standing wave and the grating plane. It is possible to compensate also for the term that contains the change in angle $\beta$ to the second power by letting R be a certain axis $C_2$ on the mirror normal through $C_1$. Also a sliding between C and the virtual plane which depends on $\beta^3$ or $\beta^4$ can to a large degree be compensated by letting R differ somewhat from $C_2$ so that terms in $\beta$ and $\beta^3$ as well as terms in $\beta^2$ and $\beta^4$ compensate each other.

5. We can define a factor of merit N, proportional to the resonator Q - value, as the number of grating grooves along the grating plane between its line of intersection C with the virtual plane and its point of intersection S with the central axis of the resonator. N will generally change, when the grating is rotated. Only if the rotation takes place about a grating line through S, will N remain unchanged. Translation of the grating parallel to the fixed mirror, always changes N but leaves the resonance frequency unchanged.

6. The tuning conditions which have been presented for the grating - mirror resonator with a plane mirror can also be applied to a resonator with a curved mirror. The tangential plane of the curved mirror surface at the intersection of the mirror and the resonator then replaces the plane mirror as a starting point for calculation of the virtual mirror plane.

The method according to the present invention gives the conditions which have to be met by a tuned grating - mirror resonator in order that it remains tuned when the position of the grating is changed. With this principle as a basis practical resonator designs can be made in which the resonance wavelength and the Q - value can be changed without mode hopping.

A principal solution for variation of the resonance wavelength has been shown with rotation of the grating about a fixed axis. The choice of rotation axis is determined by the chromatic wavelength dispersion in the resonator media. With a proper choice of axis of rotation a large wavelength range can be covered. A tolerance area for the positioning of the rotation axis that allows for the coverage of a given wavelength interval is given.

In a first embodiment of the invention a mechanically simple design is realised with rigid rotation of a bearing supported arm on which the grating is attached.

In a second embodiment of the invention a design is realised comprising a simple rotation movement of the grating with flexible bending elements.

In a third embodiment of the invention a design is realised with stiff rotation of an arm suspended in a flexible bending element on which the grating is attached.

The most important application of the embodiments mentioned above is an optical resonator for a tunable laser. In general there is a need for using a tunable laser in the mode hop free design, which can be accomplished by the invention, in measurement techniques, e.g. spectroscopy. In that case it is desirable to avoid the sudden intensity jumps which are an inevitable consequence of laser light sources with mode hopping.

As a pure optical resonator the present invention can be used in the measurement techniques as a tunable optical filter and as an interferometer. The change of the Q-value of the resonator which is accomplished by the invention makes it possible to continuously vary the wavelength sharpness of the filter or the interferometer.

Another field within which the invention can be applied is in the telecommunications field, where it gives a possibility to investigate the influence of frequency width of a laser source on signal transmission by changing the Q-value of a resonator.

1. Rigid rotation around a bearing supported shaft

The practical implementation of grating rotation around a fixed axis can be carried out in several different ways. The most simple is that the grating is mounted on a rigid arm according to FIG. 11. The arm which is mechanically guided by bearings can be rotated around its rotation center R at $x_R$, $y_R$. The bearings can be either of ball, roll or sliding type. Of course it is also possible to conceive a bearing of a more sophisticated type, e.g gas bearings or magnetic bearings.

2. Rotation by means of piezo electric devices

The axis around which the grating is rotated can also lie "outside" the mechanical devices which provide the movement. Examples of this are shown in FIG. 12a & b in which we see two different ways to use piezo electric (PZ) components to provide the rotation of the grating. PZ - components can be made to change their length when positive or negative voltage is applied to the operating electrodes of the device. It can be mentioned as an example, that if the two PZ-stacks in FIG. 12a are driven in counter phase (one expands and the other contracts) the rotation of the grating will take place around an axis which is situated between the two PX-stacks. The point of rotation can however, simply be moved in a direction, which is perpendicular to the extensions of the piles, by having one of the stacks changing its length by a larger amount than the other. In FIG. 12b the length of PZ-1 is changed more than that of PZ-2. The cases shown in FIGS. 12a & b should only be regarded as two suggested examples. It is also possible to arrange the practical design in a number of other similar ways.

3. Bending of a flexible beam

A third way to provide in a simple way for rotation around a fix axis is to use the flexibility of an elastic element (beam) according to FIG. 13a. Th elastic beam has the length h and is rigidly clamped in one of its ends. When a force F is applied, the beam will bend, and its free end, represented by the symmetry point of the end cross section, will be displaced the distance δ from its unloaded rest position. (When we further on mention the deformation of the beam we imply the deformation of the symmetry line of the beam). The beam gradually adopts a new (deformed) state of equilibrium, whereby the free end forms an angle γ with the original direction, i.e. the direction of the undeformed rotation around a fixed center of rotation R, which lies at the distance h/3 from the clamping point of the beam ($\gamma^2 < < 1$). Also if instead of applying the force F, we apply the torsional moment M' according to FIG. 13b, the free end of the flexible element will rotate around a fix axis, which in this case is at the distance h/2 from the clamping point of the beam. If a force F and moment M' are simultaneously applied the situation will be more complicated. In general the center of rotation will be a function of both the magnitudes and direction of the force and the moment. If we, however, consider the special case when the moment varies linearly with the force, that is M'=k F, the free end of the beam will rotate around a fix axis. The position of the center of rotation will, however, depend on both the length and on the magnitude of the constant of proportionality k (note that k can be both positive and negative and that we only consider small angles of deflection $\lambda^2 < < 1$).

As the rotation of a grating the flexible beam can be arranged e.g. as in FIG. 13c. In this case the grating rotates around a fictitious axis R which is fixed in space. Practically the mounting of the grating on the flexible beam can be arranged such that the point $C_2$ lands at the desired position for mode hop free tuning, that is that R is situated within the demanded tolerance area around $C_2$.

A further possible use of flexible bending is shown in FIG. 14, where the rotation takes place around a so called flexible hinge FH. Also in this case the geometrical arrangement can be chosen such, that the center of rotation R lands within the demanded tolerance area around $C_2$.

The embodiments shown in FIGS. 13c and 14 should only be regarded as typical examples of flexible bending around a fixed point. It is also possible to arrange the practical design in a number of similar ways.

a) Laser resonator with a highly reflecting mirror and a partially reflecting output mirror. Between the mirrors is a radiation amplifying material.

b) the amplification of the active material as a function of the optical frequency.

c) Possible oscillation frequencies in a laser resonator.

d) The frequency spectrum of the emitted radiation

FIG. 2

Resonator with an optical grating G as the wavelength dispersive element. M is the mean surface of the grating relief. The groove distance is d. The grating point A is situated on the mean surface of the relief grating and represents a grating groove. Note that the grating surface does not necessarily have to be of staircase type. The grating surface can for instance have a sine shape, which is sometimes the case when the grating is manufactured by holographic methods. The numeral 3 is the real mirror plane and 5 the virtual mirror plane.

The numeral 4 is a radiation amplifying material.

Figure 3B:
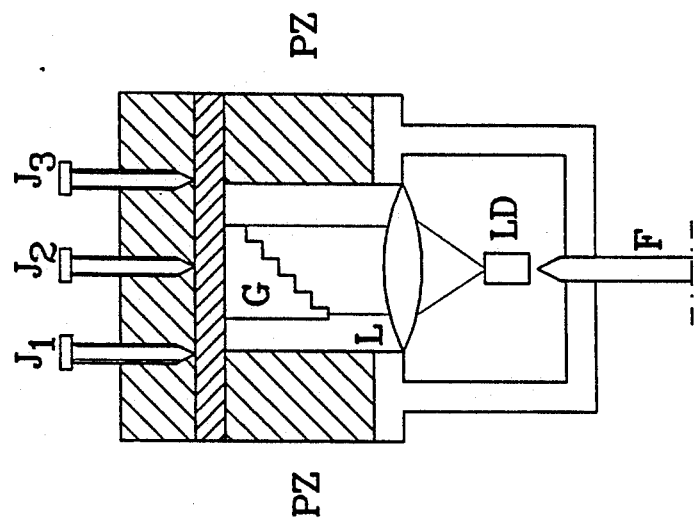
Figure 3A:
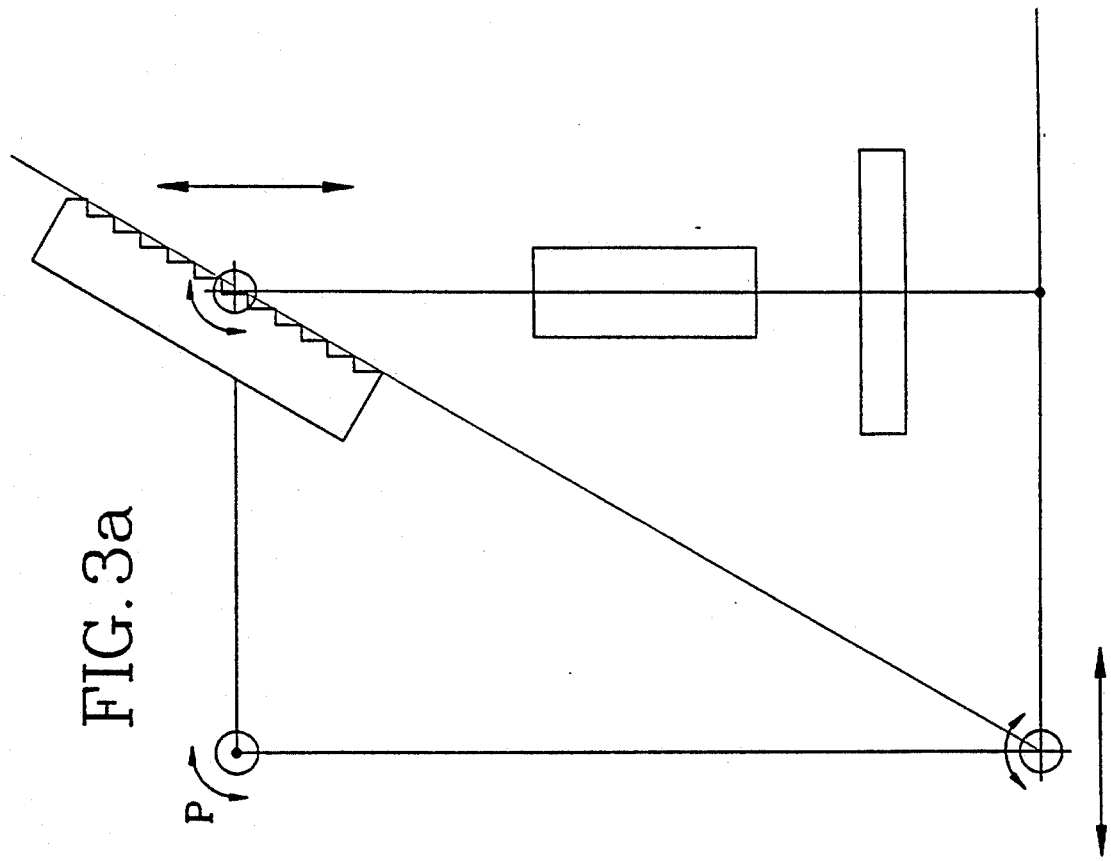

FIG. 3a. Device according to reference 1. The arrows indicate rotational and translational directions respectively.

FIG. 3b. Device according to reference 2. $J_1 - J_3$ are adjustment screws, PZ is piezo actuators G is a grating, LD is a semiconductor laser chip, F is an optical fiber and L is a collimating lens.

Figure 4:
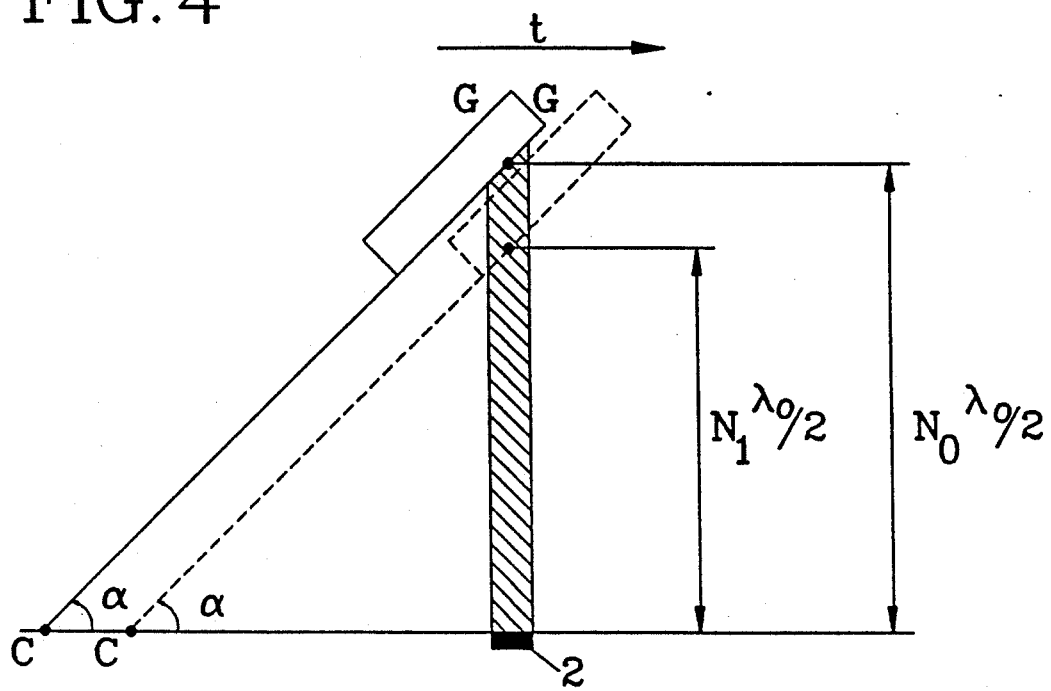

FIG. 4. Grating-mirror resonator in air (vacuum). The mirror 2 is fixed and determines the resonator position. The resonator is terminated by a movable grating G with the grating grooves parallel to the mirror plane. For discussion of the tuning condition the grating plane with its periodic structure and the mirror plane extend beyond their real extensions. Their intersection is the grating fixed line C. A relative translation t of he grating and the resonator does not affect the tuning to resonance at $\lambda_0$. On the other hand the number of half wavelengths in the standing wave along the resonator axis is changed from $N_0$ to $N_1$. The resonator medium is air. We shall in the continued discussion refer to the wavelength in air which is sued in practice instead of to the theoretical vacuum wavelength. This implies that all refraction indices will be related to air instead of to vacuum.

Figure 5:
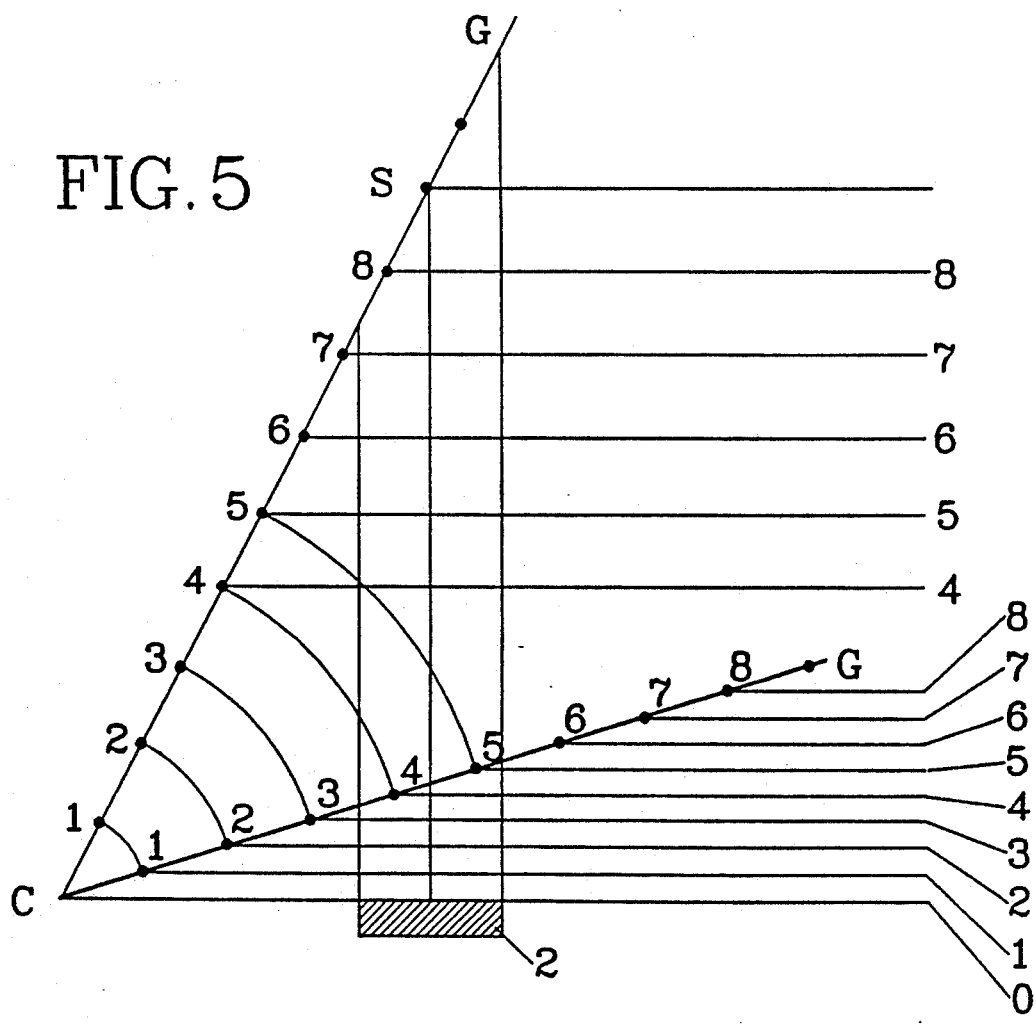

FIG. 5. In a resonator in air the number of nodal planes in the standing wave between the fixed mirror 2 and a point on the movable grating G are retained when the grating is rotated around the line of intersection C of the grating and the mirror plane. The number of nodal planes in the fixed resonator zone will however be changed.

$S_0$ and $S_1$ define the points of intersection of the grating plane and the symmetry axis of the resonator for two different grating positions. When the grating angle is changed this point of intersection slides along the grating plane.

Figure 1A:
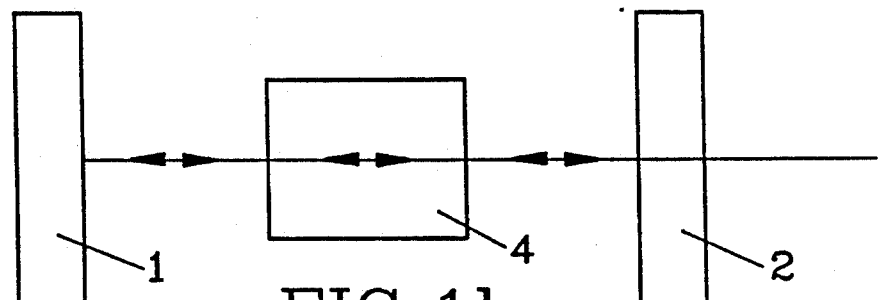
FIG. 1.
Figure 1B:
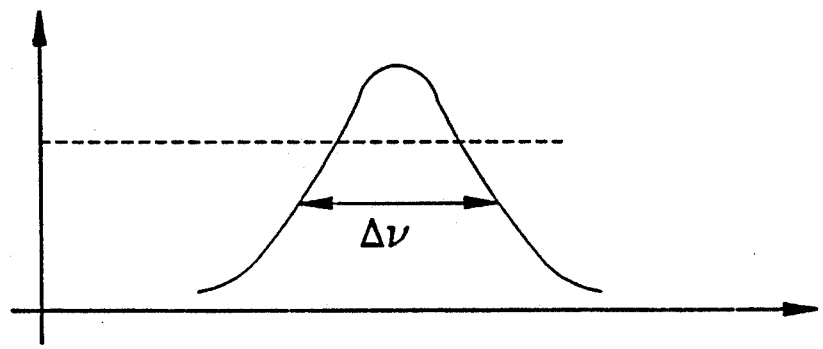
Figure 1C:
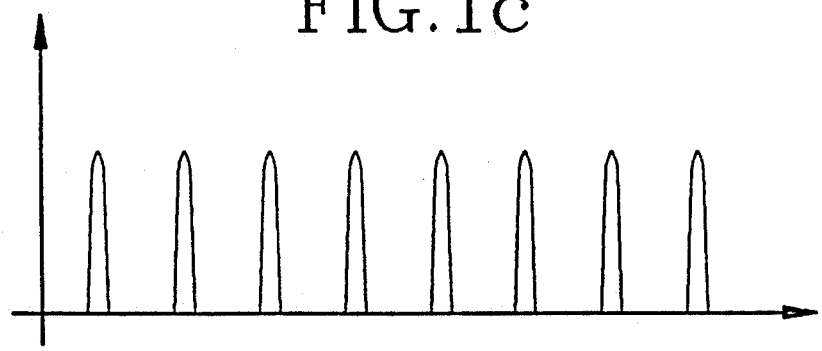
Figure 1D:
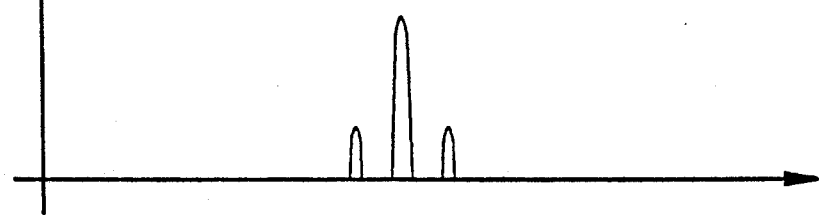
Figure 2:
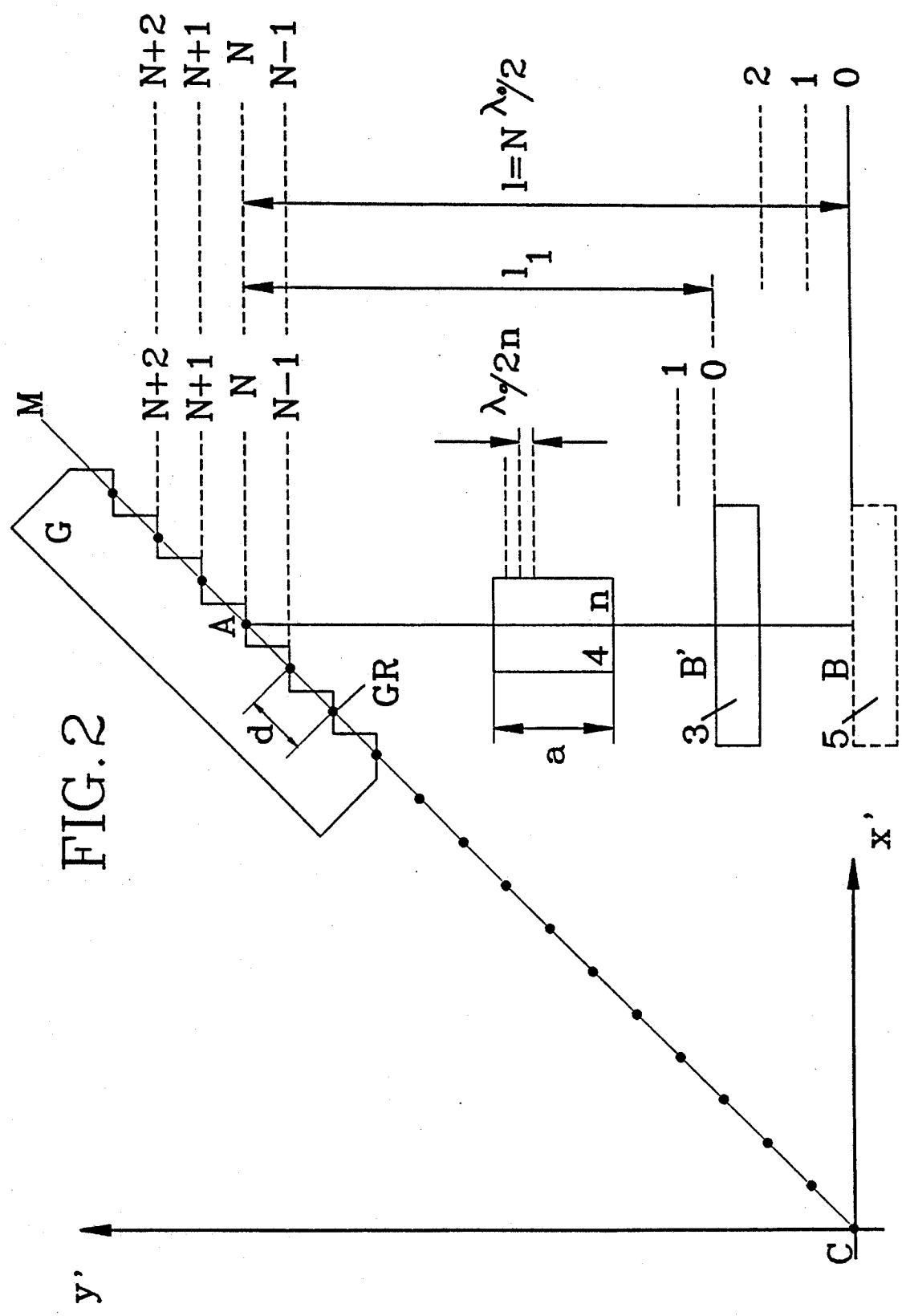
Figure 6:
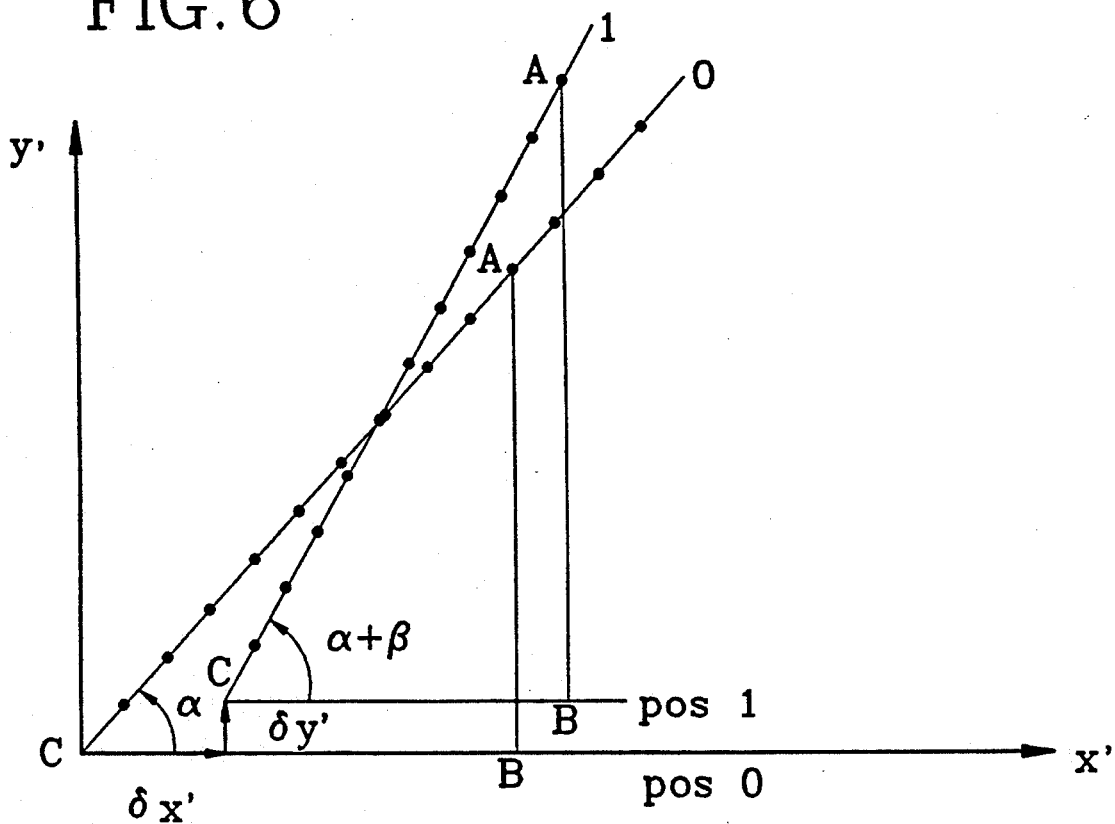

FIG. 6. Position 0 corresponds to the tuned initial situation in FIG. 2. In position 1 the grating has been moved such that the grating point C has been translated $\delta x'$, $\delta y'$ and the grating plane AC has been rotated the angle $\beta$ with respect to its initial position.

Figure 7:
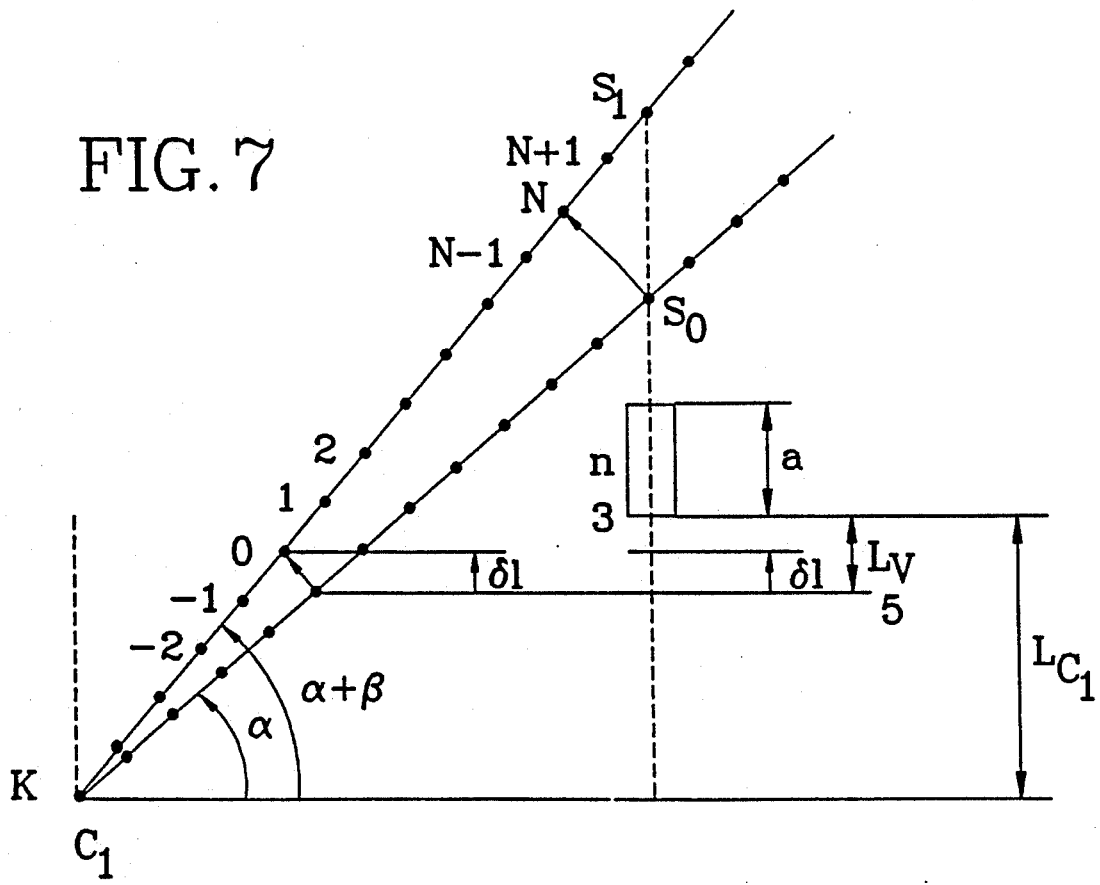

FIG. 7. The resonator mirror 2 and the rotation axis $C_1$ are fixed in space at rotation of the grating. At the grating rotation the resonator wavelength and hence the relevant plane 5 is moved $\delta 1'$ closer the fixed mirror when $\alpha$ is increased to $\alpha + \beta$. At the same time the grating fixed nodal planes are displaced in the same direction when $\alpha$ is increased. In order to retain the tuning the displacement $\delta 1$ of the grating line C and the nodal plane 0 shall correspond to $\delta 1'$. This is possible with a refractive index n which varies linearly with the wavelength.

Figure 8:
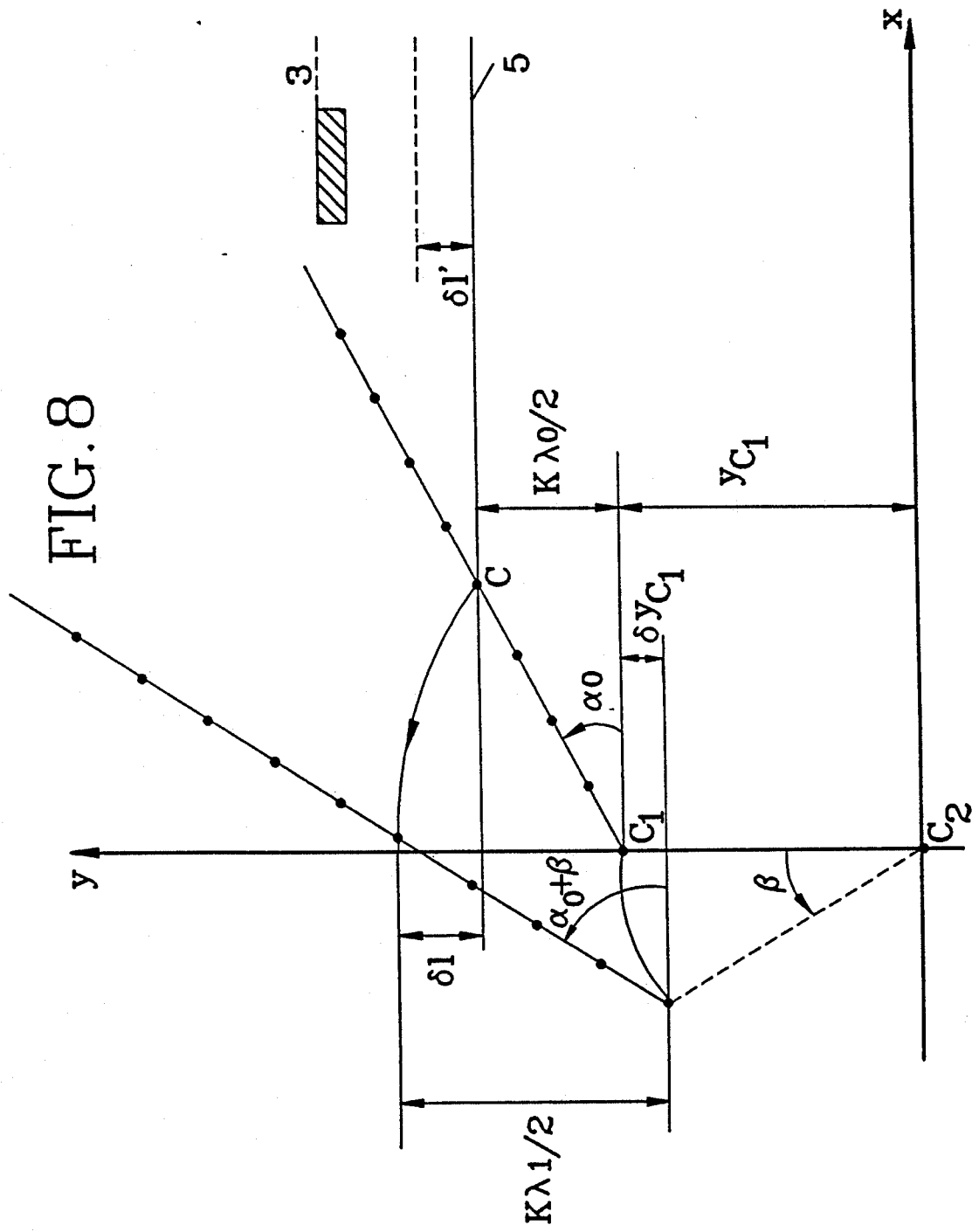

FIG. 8. Calculation of the sliding $\delta 1 - \delta 1'$ of the C-axis with respect to the virtual mirror plane 5 at a rotation $\beta$ around an axis $C_2$ on the mirror normal through $C_1$.

Figure 9:
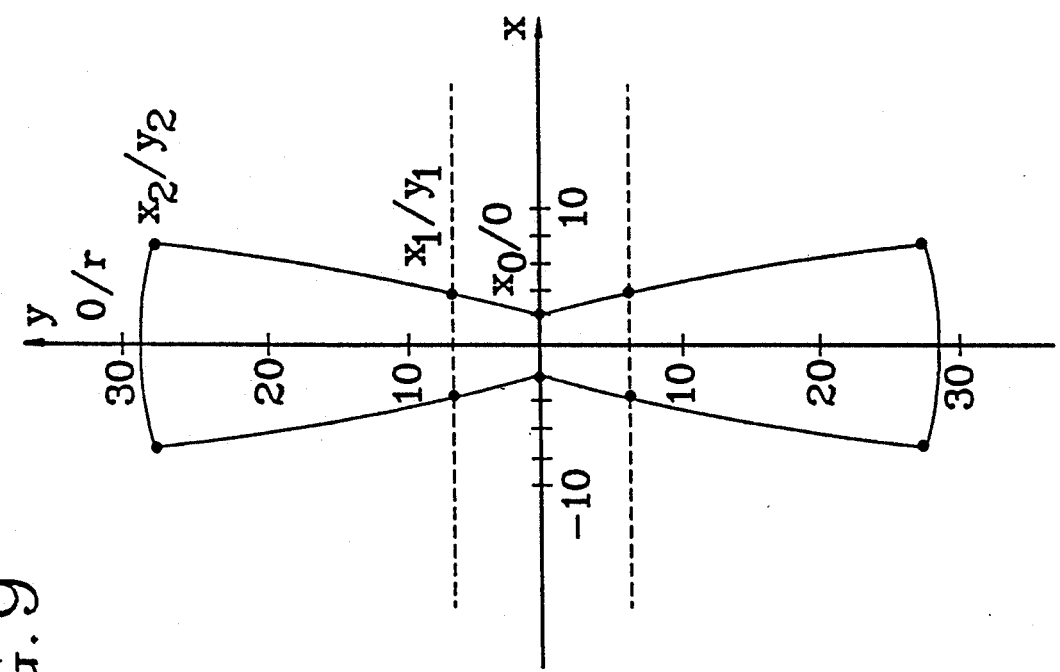

FIG. 9. The tolerance area around $C_2$ for locating the rotation axis R. The allowed total rotation $\beta_s > \beta_g$ is in each quadrant limited to a zone given by a line ($x_0$, o to $x_1$, $y_1$), a parabola ($x_1$, $y_1$ to $x_2$, $y_2$) and a circle ($x_2$, $y_2$ to 0, r).

Figure 10:
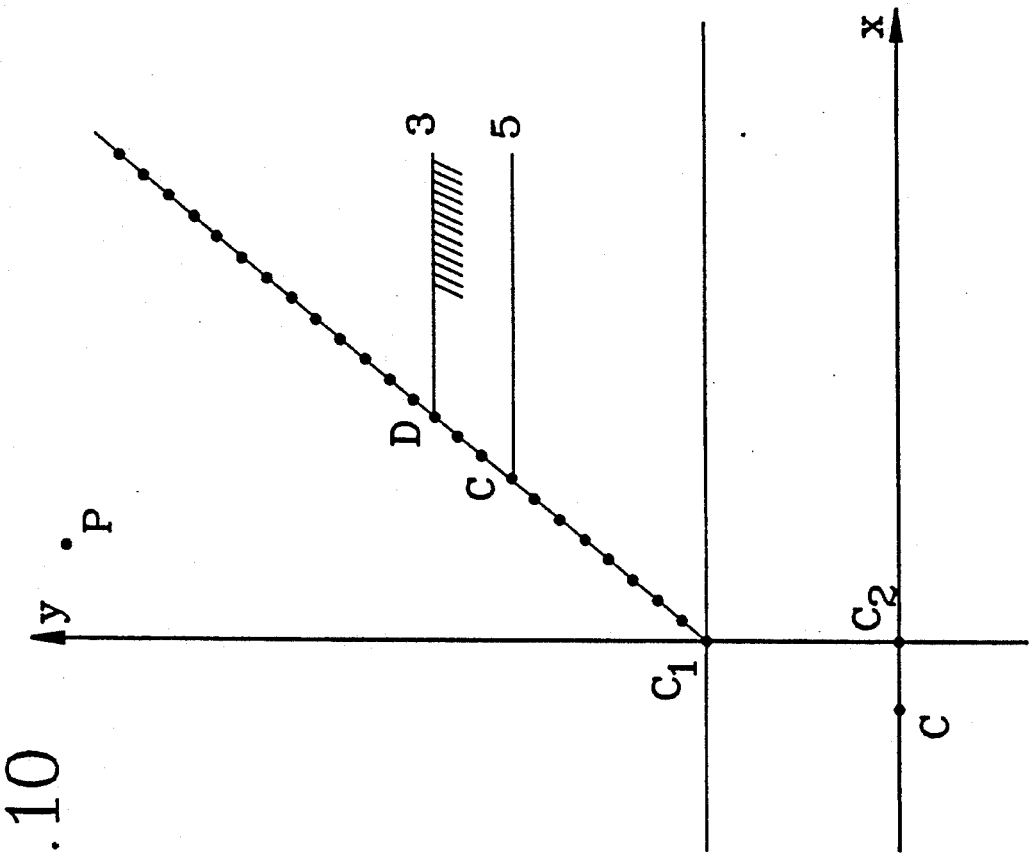

FIG. 10. The positions of the rotation axes which are used in the table of section 4.3. The position of the rotation axis P which is used in reference 1 is not quite clear, but for a schematic calculation of $\beta_s$ it is sufficient that it lies about 90 mm from the mirror used and from the reference planes.

Figure 11:
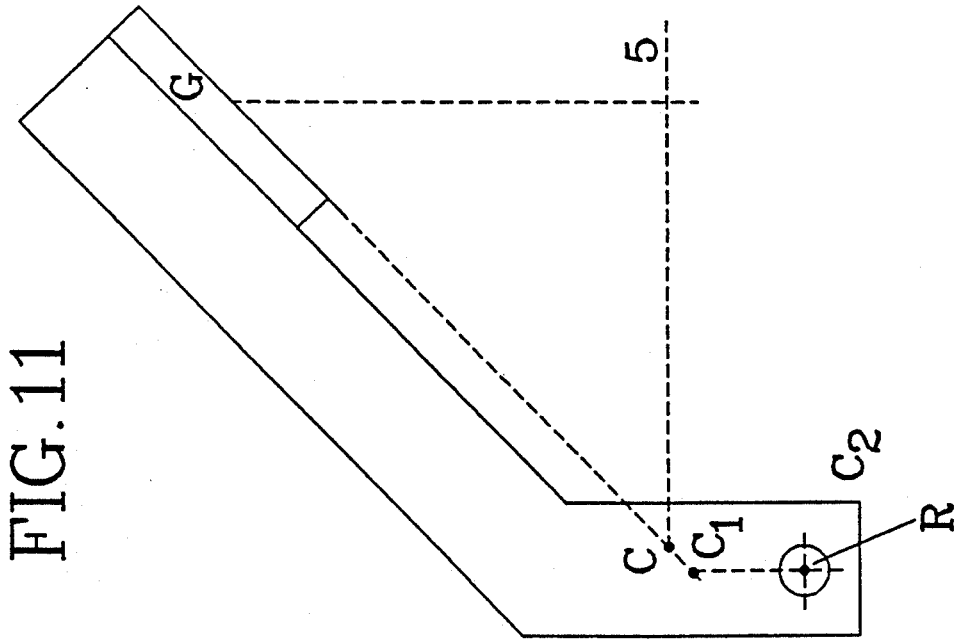

FIG. 11. The grating G is mounted on a rigid arm which can be rotated around the axis R in $x_R$, $y_R$. R is situated in the demanded tolerance area around $C_2$.

Figure 12A:
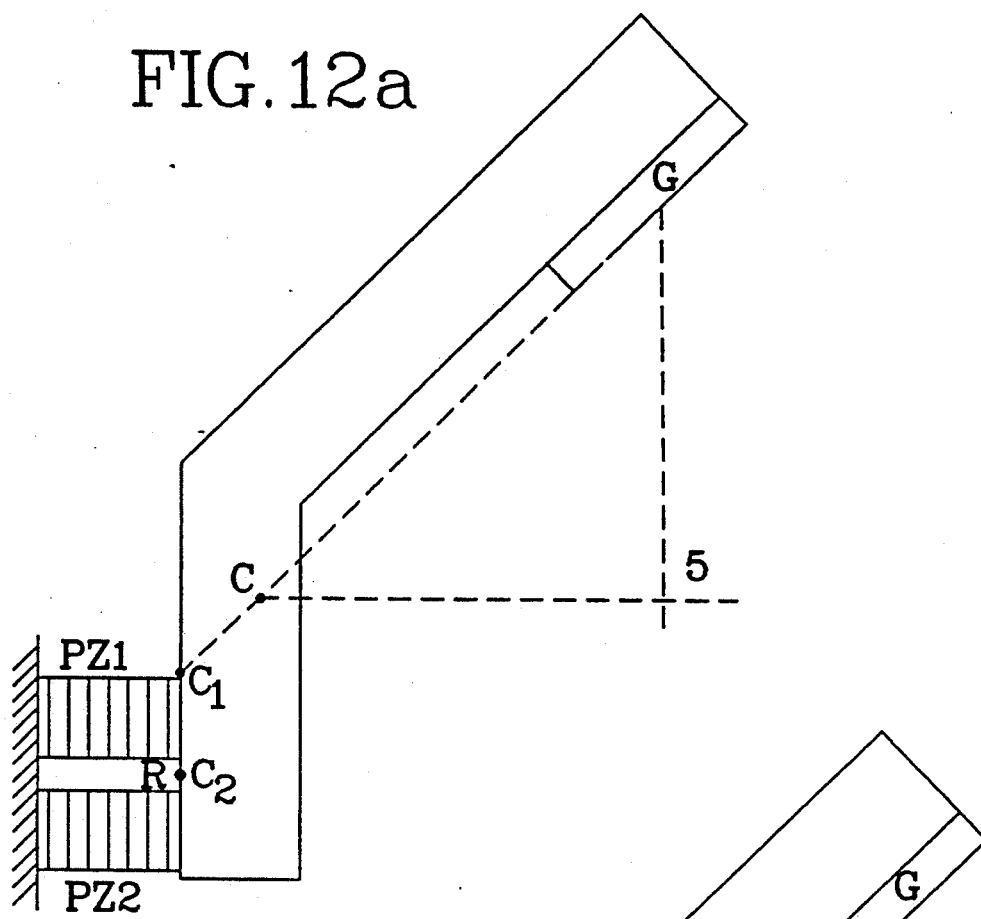
Figure 12B:
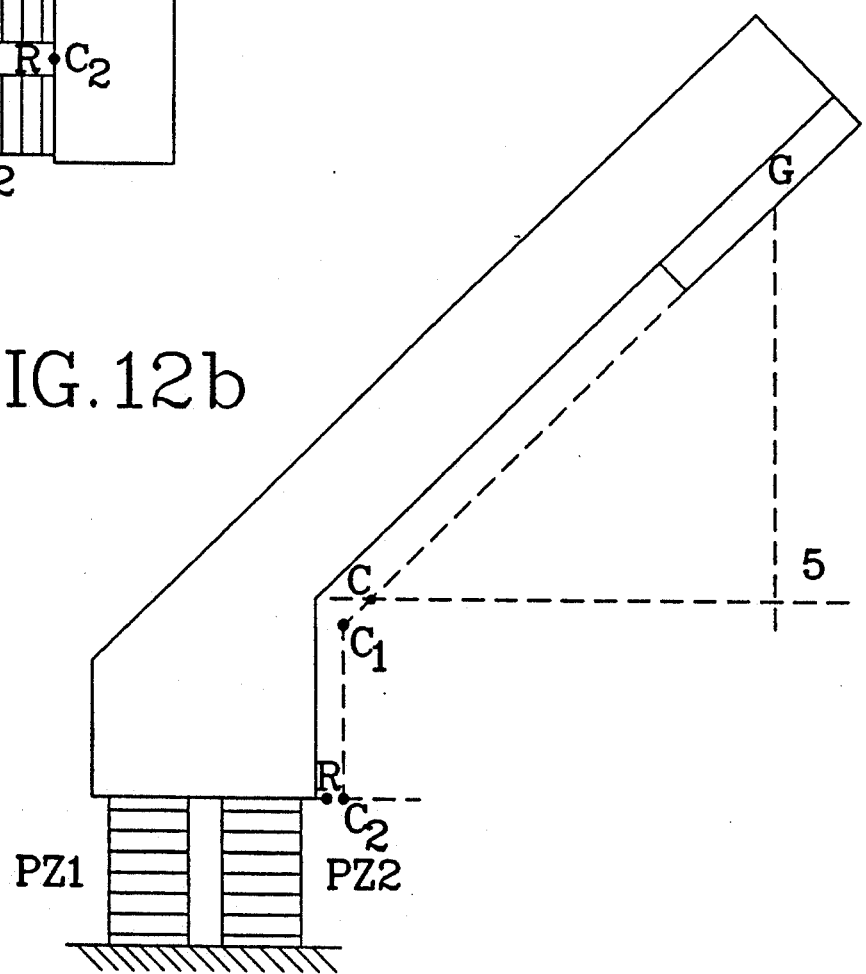

FIG. 12a & b. Grating rotation by means of piezo electric (PZ) components. In FIG. 12a the grating is rotated around a point R which lies between the two PZ stacks. In FIG. 12b the rotation point is displaced laterally at right angles to the two PZ stacks. In both cases the geometry is chosen such that R lies within the demanded tolerance area.

Figure 13A:
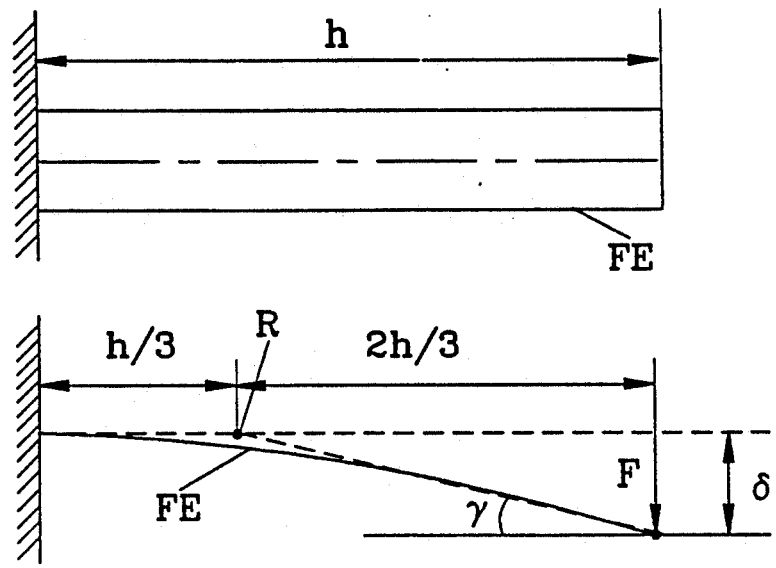

FIG. 13a. Bending of a flexible element which is rigidly clamped at one end. The deformation is made by the force F which acts at a distance h from the clamping plane, and the free end of the beam rotates around a point R at the distance h/3 from the point of clamping.

Figure 13B:
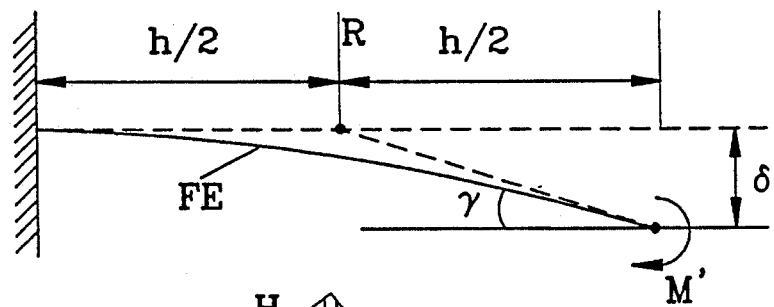

FIG. 13b. The flexible element is deformed by the torsional moment M' acting at the free end of the beam. In this case the free end rotates about a point R at the distance h/2 from the clamping plane.

Figure 13C:
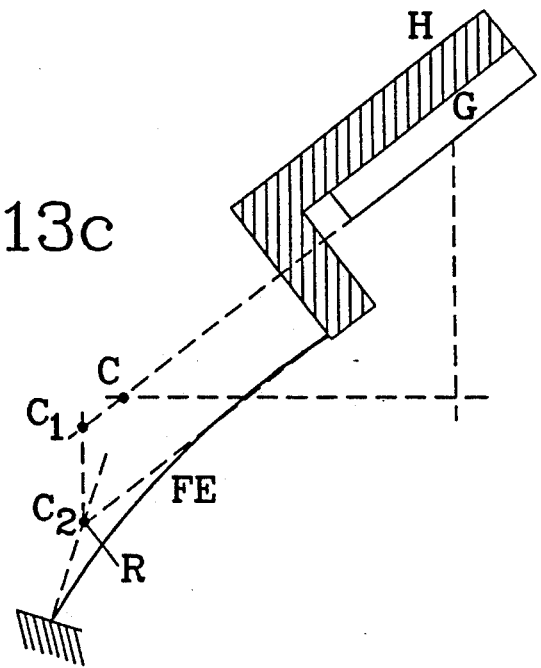

FIG. 13c. The grating G is by means of the holder H fixed to a flexible bending element FE. The flexible beam is in the figure represented by its axial symmetry line. The clamping point is chosen such that the center of curvature of the beam coincides with the point $C_2$ or is situated within the demanded tolerance area about $C_2$.

Figure 14:
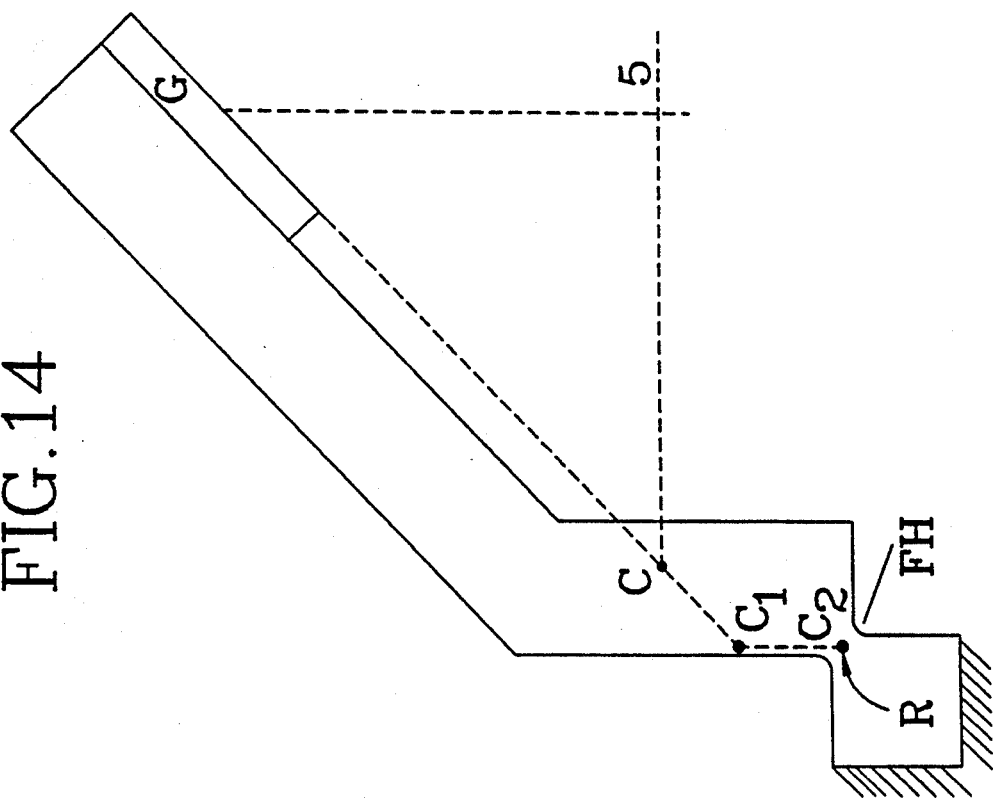

FIG. 14. Grating rotation about an elastic flexible hinge FH.

We claim:

1. Method to ensure tuning without mode hopping of the resonator frequency and tuning of the Q - value of an optical resonator of the type comprising a partially reflecting resonator mirror (2) and a movable reflecting optical grating, with grooves (GR) parallel to the resonator mirror, intended to function as a wavelength selective reflector and which may comprise optical elements between the mirror and the grating, said optical elements being intended for collimation, amplification (4) and filtering of the radiation in the resonator characterized therein, that when changing the resonance wavelength ($\lambda$) of the resonator or its Q - value, the grating is moved in such a way that a line (C) on the grating, which is defined at a tuned initial position of the resonator by the intersection of the plane of grating grooves (M) and the virtual mirror plane (5) of the resonator mirror, remains at a distance less than $\lambda/4$ from the virtual mirror plane, which as a result of chromatic dispersion in the resonator media slides in distance to the fixed mirror with said resonator wavelength during the movement.

2. Method according to claim 1 characterized therein, that the resonance wavelength ($\lambda$) is changed when the grating (G) is rotated about a real or virtual axis, which is fix with respect to the resonator mirror (2).

3. Method according to claim 1 characterized therein, that the resonance wavelength ($\lambda$) is changed when the grating (G) is rotated about a real or virtual axis which is being translated or has been translated with respect to the resonator mirror (2) parallel to its mirror plane (3).

4. Device according to claim 3 characterized therein, that the resonance wavelength ($\lambda$) is changed when rotating about an axis ($C_2$) so selected, that at a rotation by an angle ($\beta$) from the tuned initial position, the arising slide of the line (C) on the grating (G) with respect to the virtual mirror plane (5) can be described by an expression in powers of ($\beta$) which only contains terms of ($\beta$) in third and higher powers.

5. Device according to claim 3 characterized therein, that the resonance wavelength ($\lambda$) is changed when rotating about an axis located within a rectangular area, which is centered around the axis ($C_2$) in an initial position, and which has the length $80000\lambda$ in the direction of the mirror normal and the width $400\lambda$.

6. Device for carrying out the method according to claim 5 comprising an optical resonator, that contains a partially reflecting resonator mirror (2) and a movable reflecting optical grating with grooves (GR) parallel to the resonator mirror intended to work as a wavelength selective reflector and which may comprise optical elements between the mirror and the grating, said optical elements being intended for collimation and amplification (4) of the radiation in the resonator characterized therein, that the rotation axis R is constituted by a bearing supported shaft with the optical grating arranged on a rigid arm rotatable around R.

7. Device according to claim 1 characterized therein, that the grating (G) is translated parallel to the resonator mirror (2) whereby the Q - value of the resonator is changed at a retained resonance frequency.

8. Device for carrying out the method according to claim 1 comprising an optical resonator, that contains a partially reflecting resonator mirror (2) and a movable reflecting optical grating with grooves (GR) parallel to the resonator mirror intended to work as a wavelength selective reflector, and which may comprise optical elements between the mirror and the grating, said optical elements being intended for collimation and amplification (4) of the radiation in the resonator characterized therein, that the grating movement is accomplished by a flexible bending element.

9. Device according to claim 8 characterized therein that the grating rotation takes place about a flexible bending hinge (FH).

10. Device according to claim 8 characterized therein, that the optical grating is attached to one end of a flexible beam (FE), which at its other end is clamped, and which has a force (F) applied to the grating end, whereby the beam takes a deformed state of equilibrium so that the free end forms a certain angle ($\gamma$) with the original direction of the undeformed beam implying a rotation of the grating around a center, which lies at a distance of ⅓ of the length of the beam from the clamping point.

11. Device according to claim 8 characterized therein, that the optical grating is attached to one end of a flexible beam (FE), which at its other end is clamped, and which has a torsional moment (M') applied to the grating end whereby the beam takes a deformed state of equilibrium so that the free end forms a certain angle ($\gamma$) with the original direction of the undeformed beam, implying a rotation of the grating around a center, which lies at a distance ½ of the length of the beam from the clamping point.

12. Device according to claim 8 characterized therein, that the optical grating is attached to one end of a flexible beam (FE), which at its other end is clamped, and which has a force (F) and a rotating moment (M') proportional to F applied at the grating end, whereby the beam takes a deformed state of equilibrium, so that the free end forms a certain angle ($\gamma$) with the original direction of the undeformed beam, implying a rotation of the grating around a center, which is situated in a point on the undeformed beam or its extension.

* * * * *

UNITED STATES PATENT AND TRADEMARK OFFICE
CERTIFICATE OF CORRECTION

PATENT NO. : 5,255,273

DATED : 19 October 1993

INVENTOR(S) : Nilsson et al.

It is certified that error appears in the above-indentified patent and that said Letters Patent is hereby corrected as shown below:

Column 1, line 32, delete "with" insert --when--.
Column 1, line 56, delete "s" insert --a--.
Column 1, line 57-58, delete "resonating" insert --resonator--.
Column 1, line 64, insert --is-- after the word "3a".
Column 2, line 48, move "(2)" to end of line.
Column 2, line 61, insert --position, while a plane relief is movable relative-- after the word "fixed".
Column 3, line 21, insert --medium. We consider a virtual mirror surface 5 in Fig. 2,-- after the word "the".
Column 3, page 34, delete "Ab'" insert --AB'B--.
Column 3, page 41, delete "0,1,2,111 N," insert --0,1,2,...., N,--.
Column 3, line 54, insert --where 1 is the geometrical distance AB'-- after the figure "(3)".
Column 4, after lines 55 and 58, insert double spacing for a heading.
Column 5, line 9, delete "=n'$_o$..." insert --=n''$_o$--.
Column 5, line 32, insert --(10)-- after the letters "n'$_o$".
Column 5, line 46, delete "L$_{c1}$" insert --$L_{c_1}$--.
Column 5, line 46, insert --(12)-- after the numeral "/2".
Column 5, line 52, delete "C$_{c1}$" insert --$L_{c_1}$--.
Column 5, line 68, delete "λ $_{62}$" insert --$\lambda_\beta$--.
Column 6, lines 4 and 14, delete "y$_{c1}$" insert --$y_{c_1}$--.
Column 6, lines 26 and 28, delete "δ y$_{c2}$" insert --$\delta Y_{c_2}$--.

UNITED STATES PATENT AND TRADEMARK OFFICE
CERTIFICATE OF CORRECTION

PATENT NO. : 5,255,273

DATED : 19 October 1993

INVENTOR(S) : Nilsson et al.

PAGE 2 of 3

It is certified that error appears in the above-identified patent and that said Letters Patent is hereby corrected as shown below:

Column 6, lines 26, 33, 51, 60 and 65, delete "yR" insert $--Y_R--$.

Column 6, line 39, delete "x'$_{c2}$)" insert $--x'_{c_2})--$

Column 6, line 39, delete "y'$_{c2}$)" insert $--y'_{c_2})--$.

Column 6, line 43, delete "x'$_{c1}$=a λ n'cot a$_o$y'$_{c1}$=a λ o n'$_o$ 3'$_{c2}$=3'$_{c1}$'" insert $--x'_{c_1}=a\lambda_o n'\cot a_o,\ y'_{c_1}=a\lambda_o n'_o;\ x'_{c_2}=x'_{c_1}',--$.

Column 6, line 48, delete ""δN/" insert $--|\delta N|.---$.

Column 7, line 11, delete "t" insert --to--.

Column 7, line 12, delete "3√4" insert $--\sqrt[3]{4}--$.

Column 8, line 1, delete "x'$_{c1}$" insert $--x'_{c_1}--$.

Column 8, line 1, delete "y'$_{c1}$" insert $--y'_{c_1}--$.

Column 8, line 2, delete "x'$_{c2}$" insert $--x'_{c_2}--$.

Column 8, line 2, delete "y'$_{c2}$" insert $--y'_{c_2}--$.

Column 10, line 28, delete "xR,YR" insert $--x_R,y_R--$.

Column 12, line 60, delete "xR,YR" insert $--x_R,y_R--$.

Column 10, line 44, delete "PX" insert --PZ--.

Column 10, line 67, insert --element. The movement of the free end of the beam implies, a-- after the word "undeformed".

Column 11, line 17, delete "λ2" insert $--\gamma^2--$.

Column 11, line 18, delete "As" and insert --At--.

Column 11, line 49, insert --The section plane is perpendicular to the grating grooves GR-- after the word "relief".

Column 12, line 11, delete "sued" insert --used--.

UNITED STATES PATENT AND TRADEMARK OFFICE
CERTIFICATE OF CORRECTION

PATENT NO. : 5,255,273

DATED : 19 October 1993

INVENTOR(S) : Nilsson et al.

It is certified that error appears in the above-identified patent and that said Letters Patent is hereby corrected as shown below:

Column 12, line 36, insert --refractive indices in the resonator are shifted. The virtual-- after the word "relevant".

Column 12, line 60, delete "XR, YR." should read --$X_R$, $Y_R$.--

Column 14, line 15, delete "   Device" and insert --Method--.

Signed and Sealed this

Seventh Day of January, 1997

Attest:

BRUCE LEHMAN

Attesting Officer

Commissioner of Patents and Trademarks